United States Patent [19]
Pelella et al.

[11] Patent Number: 5,552,745
[45] Date of Patent: Sep. 3, 1996

[54] SELF-RESETTING CMOS MULTIPLEXER WITH STATIC OUTPUT DRIVER

[75] Inventors: Antonio R. Pelella, Highland Falls; Yuen H. Chan, Poughkeepsie, both of N.Y.

[73] Assignee: International Business Machines Corporation, Armonk, N.Y.

[21] Appl. No.: 309,811

[22] Filed: Sep. 21, 1994

[51] Int. Cl.[6] .................... H03K 17/62; H03K 3/02; H03K 3/037

[52] U.S. Cl. .................... 327/407; 327/408; 327/410; 327/198; 327/219

[58] Field of Search .................... 327/407, 408, 327/198, 199, 200, 202, 206, 208, 299, 410

[56] References Cited

U.S. PATENT DOCUMENTS

| | | | |
|---|---|---|---|
| 5,155,380 | 10/1992 | Hwang et al. | 327/176 |
| 5,164,612 | 11/1992 | Kaplinsky | 327/408 |
| 5,250,852 | 10/1993 | Ovens et al. | 327/208 |
| 5,280,202 | 1/1994 | Chan et al. | 327/407 |
| 5,295,174 | 3/1994 | Shimizu | 327/407 |

*Primary Examiner*—David C. Nelms
*Assistant Examiner*—Trong Phan
*Attorney, Agent, or Firm*—Lynn L. Augspurger; Peter Visserman

[57] ABSTRACT

Output signals from a plurality of self reset CMOS a logic circuits are multiplexed by means of the plurality of input multiplex circuits and an output circuit. The multiplex circuits are individually enabled by means of a select lead and true and complement input signals to the multiplex circuits are supplied to input terminals of an output circuit in which the state of the true or complement input is latched to provide a static output. The inputs to the output circuits simultaneously provide an output and initiate the setting of the latch by means of a separate latch setting gate. An inverter tree within the output circuit maintains the state of the output on the output terminal of the output circuit after the latch has been reset. A test access to the output circuit allows a test signal to be gated into a test latch and subsequently gated into the primary latch of the output circuit to provide a test output. The state of the select signal and of the input signals may be latched in the input circuit for proper pulse alignment.

16 Claims, 5 Drawing Sheets

SELF-RESETTING CMOS MULTIPLEXER WITH STATIC OUTPUT DRIVER

BACKGROUND OF THE INVENTION

1. Field of the Invention

This invention relates to a self-resetting CMOS (SRCMOS) circuitry and more particularly to SRCMOS circuitry for converting a pulsed input signal to a static output signal for circuitry requiring longer duration signals.

2. Description of Related Art

Microprocessors use static CMOS logic which must properly interface with self-resetting CMOS logic circuits which require short duration pulsed inputs and memory circuits which require inputs of longer duration or "static" inputs. It is a common practice to convert the static input signals to pulsed signals compatible with self-resetting CMOS circuits and converting the resulting output signals of the self-resetting CMOS signals back to static signals. A design problem is to minimize the time required for the conversion process in order to avoid increasing the overall time for the performance of logic operations. It is a common practice to multiplex the pulsed output signals of a plurality of self-resetting CMOS circuits and to provide a sequence of static output signals from the multiplex circuit. FIG. 1 shows a typical prior art 4-to-1 multiplexer. The circuit 100 has four select leads, A through D and four sets of true and complement data inputs, Ta through Td and Ca through Cd. The select leads A through D are activated in sequence to provide an output on the output terminal 101 representative of a corresponding true or complement input. The input is latched in the multiplex circuit to provide a static output signal in response to a short duration pulsed input, to provide an appropriate output signal for use with static CMOS logic circuitry used in the design of a microprocessor or the like. Significant time delay is introduced by prior art multiplex circuitry, negatively affecting the overall performance of data processing systems.

SUMMARY OF INVENTION

These and other problems of the prior art are solved in accordance with this invention by the use of self-resetting CMOS multiplexing elements and a SRCMOS-to-static output driver. The self-resetting multiplexing elements are reset by a first reset pulse generated in response to an output from any of a plurality of multiplex circuits having their true outputs and complement outputs connected together, after a pre-defined delay determined by a reset chain. The true or complement outputs from a set of multiplex circuits is latched in a driver latch which is reset by means of a second pulse generated a predetermined period of time after the first reset pulse. The true and complement outputs from each of the multiplex circuits is individually activated two gate delays after the input data pulse has been received, which is expected to occur some period of time after activation of the associated select lead. The output is latched in the multiplex circuit, also after two gate delays, to allow short duration input pulses to be registered in the multiplex circuits. The outputs of the multiplex circuits are connected together to form a wired-OR and are connected to the inputs of a driver and latch circuit. The driver and latch circuit is arranged such that the C or T input signals are provided at the output of the driver and latch circuit within two gate delays of the input. The true and complement inputs to the driver and latch circuit are connected to a latch via a latch-setting gate. The use of the latch-setting gate advantageously avoids the substantial current drain on the input signal typically required of a latch, since the required current is supplied by the latch-setting gate. In one particular embodiment of the invention, the input circuit is provided with pulse alignment latches in which the select input to the input circuit is latched and the true and complement inputs are latched as well. Advantageously, this assures the proper overlap between the select pulse and input pulses. The select lead, besides being connected to the latch, is also connected to a pair of enable gates to enable the circuit and the true and complement inputs are directly connected to input gates, independent of the latches. Advantageously, this arrangement provides stabilized outputs without being effected by delays due to latching operations.

BRIEF DESCRIPTION OF THE DRAWINGS

The invention will now be described with reference to the drawings wherein.

DETAILED DESCRIPTION

Figure 1:
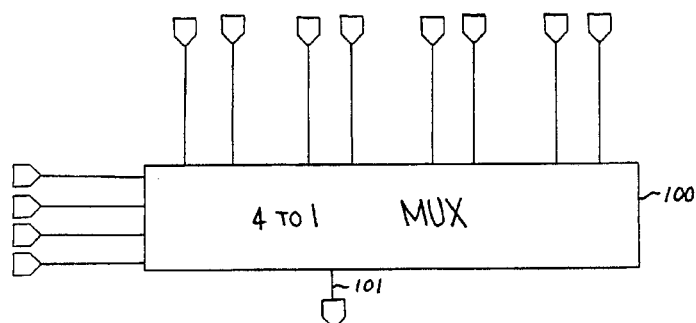
FIG. 1 is a representation of a prior art multiplexer.
Figure 2:
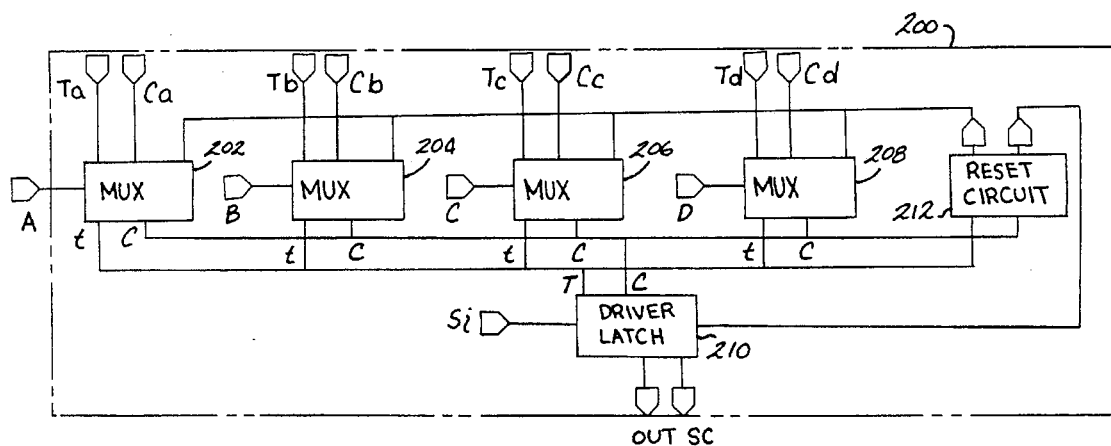
FIG. 2 is a block diagram representation of a multiplexer circuit incorporating the principles of the invention.

FIG. 2 shows a 4 to 1 multiplexer 200 incorporating principles of the invention. The multiplexer 200 comprises four individual multiplex elements or circuits, 202, 204, 206 and 208. Each of the circuits has a true (T) and complement (C) input receiving short duration input pulses generated by a self-reset CMOS logic circuit (not shown in the drawing) or the like. The four multiplex circuits 202, 204, 206, and 208 each have a select input (A, B, C and D), respectively generated by a select standard control circuit (not shown in the drawing). In each case, the select input enables the associated circuit to respond to a true or complement data input. Each of the circuits also has a true (t) and complement (c) output which are separately connected to form a wired-OR true output (T) and a wired (OR) complement output (C). The OR-ed outputs are connected to a driver and latch circuit 210 which generates a single static output. A reset circuit 212 is connected to the t and c outputs to initiate a reset of the individual multiplex circuits 202, 204, 206, and 208 as well as the reset of the driver and circuit latch 210, asynchronously, a predetermined period a time after either the T or the C output is activated.

Figure 3:
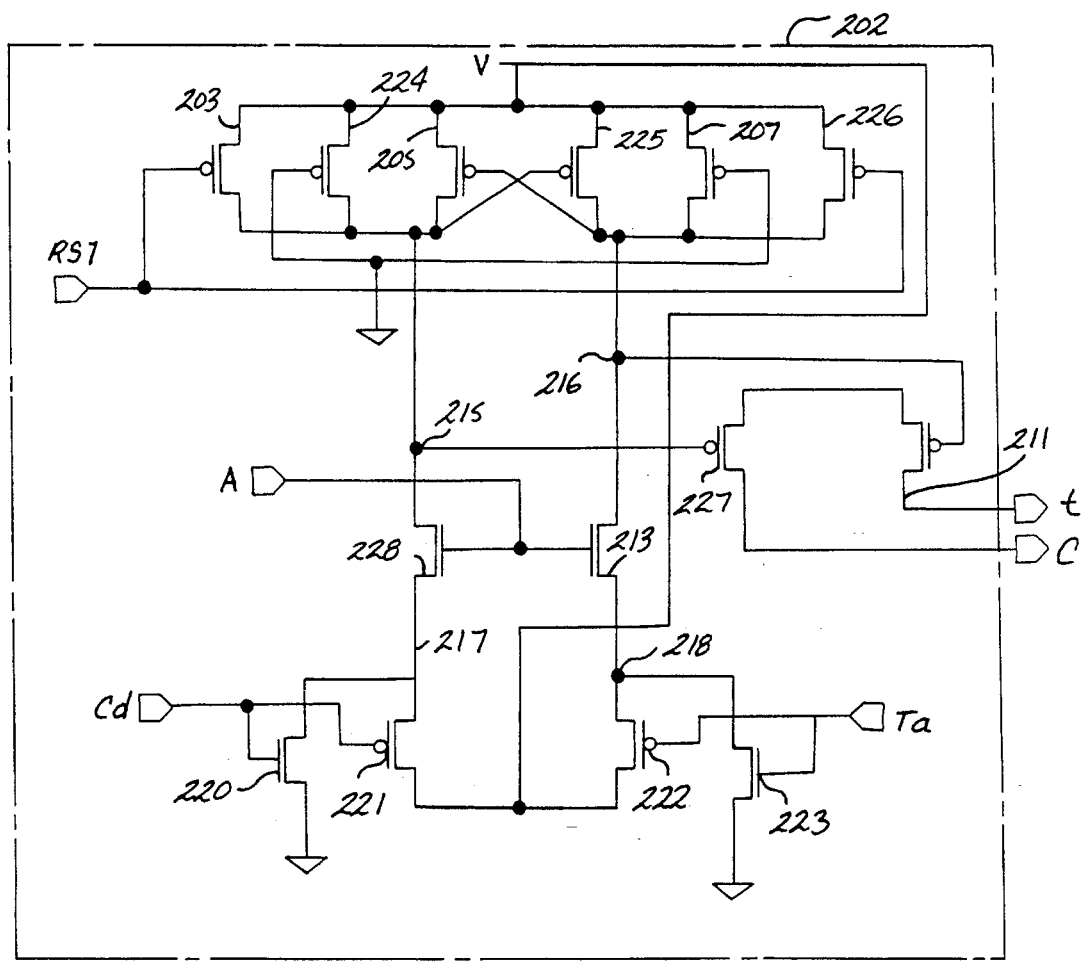
FIG. 3 is a circuit diagram representation of one of the multiplexer elements of the multiplexer of FIG. 2.

FIG. 3 is a circuit diagram representation of the multiplex circuit 202 of FIG. 2. Multiplex circuits 204, 206 and 208 are identical to circuit 202 except for the input designations. As shown in FIG. 3, the circuit 202 has a select input A and true and complement data inputs Ta and Ca, respectively. The circuit also has true and complement outputs in t and c, respectively, as well as a reset input RS1. The circuit comprises a plurality of PFET MOS gates and a plurality of NFET MOS gates, referred to herein as p-type gates and n-type gates, respectively. In normal operation, the circuit, which is initially in the standby state, is enabled by the select input A prior to the occurrence of a pulse on the true Ta or complement Ca inputs. The A input is connected to the gate of a pair of n-type gates 228 and 213, as shown in FIG. 3, and a high logic level select signal on input A activates these gates. The Ca input is connected to the gate input of a n-type gate 220 and a p-type gate 221. Similarly, the Ta input is connected to the gate input of an n-type gate 223 and a p-type gate 222. When a short duration input signal such as a high logic level output pulse from a self-resetting CMOS logic circuit is applied to the Ca input, gate 221 is disabled and gate 220 is enabled providing a low logic level at node 217. Because of activation of gate 228 by a select signal on input A, the node 215, connected to the gate input of p-type gate 227, causes gate 227 to conduct. This provides a high logic level from the voltage source V on the c output terminal of the circuit. Similarly, when a high logic pulse occurs on input Ta, gate 222 will be turned off and gate 223 will be turned on providing a low logic level at node 218. Consequently, because of activation of gate 213 from the select input, node 216 which is connected to the gate input of p-type gate 211 will cause this gate to conduct providing a high logic output from voltage source V on output t.

The nodes 215 and 216 are connected to cross-coupled p-type logic gates 205 and 225. When the node 215 assumes the low logic level by connection to ground through n-type gates 228 and 220, the p-type gate 225 will conduct providing a positive signal level at node 216 from the voltage source V. Similarly, when the node 216 assumes the low logic level by connection to ground through gates 213 and 223, the gate 205 will conduct providing a high voltage level to node 215. When the data inputs Ca and Ta are at the low logic level, the gates 220 and 223 are turned off and gates 221 and 222 are turned on providing a high voltage level at nodes 217 and 218. The circuit 202 is reset by means of a low going pulse on input RS1, which is connected to the gate inputs of p-type gates 203 and 226. The low going pulse will cause these gates to conduct to provide a charging current to nodes 215 and 216. P-type gates 224 and 207 have their gate inputs connected to ground to provide a low magnitude current to the nodes 215 and 216.

Figure 4:
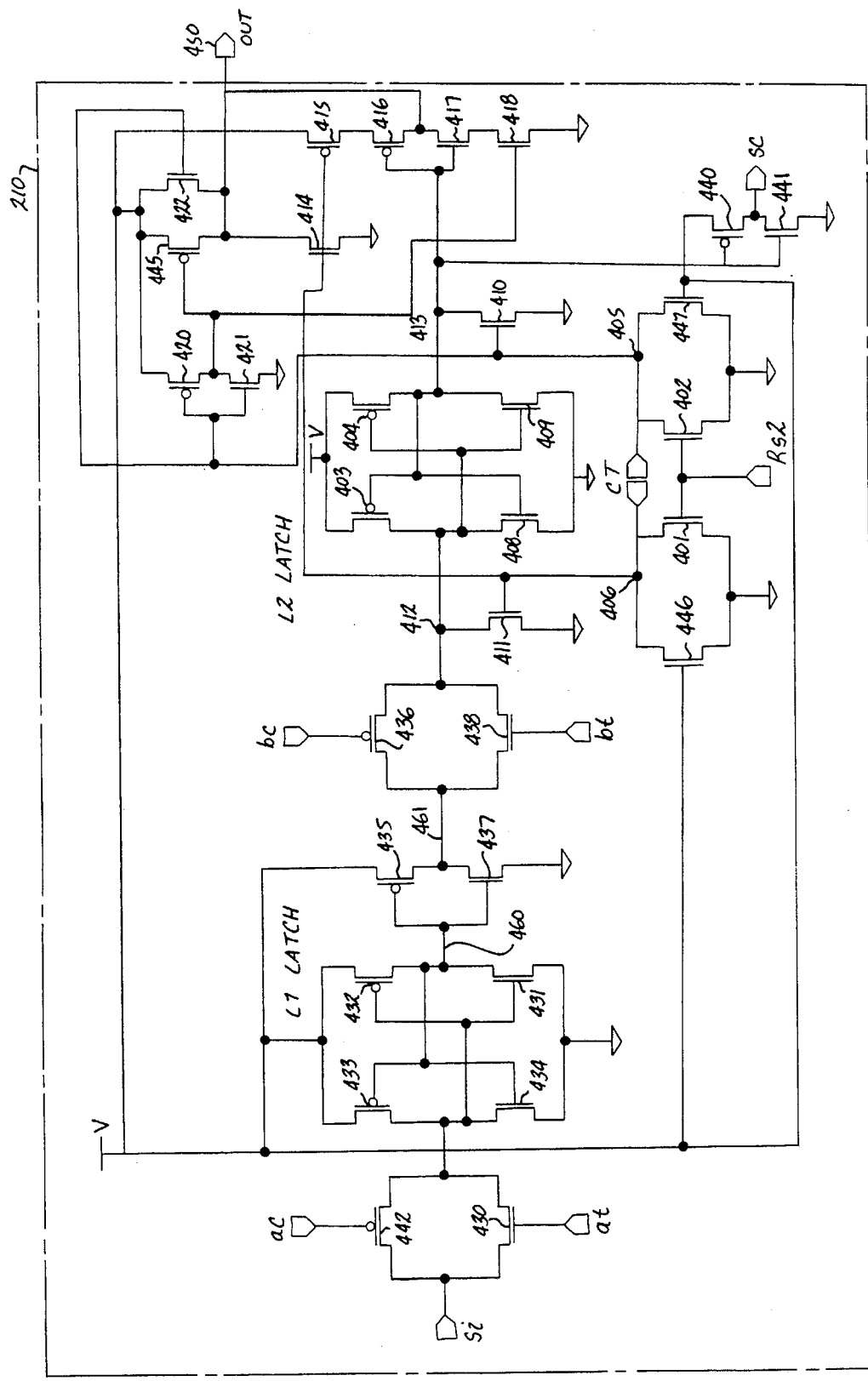
FIG. 4 is a circuit diagram representation of the driver and latch circuit of FIG. 2.

FIG. 4 is a circuit diagram representation of the driver and latch circuit 210 shown in FIG. 2. FIG. 2 shows the inputs C and T which represent the wired-or of the outputs c and t of the MUX circuits 202, 204, 206 and 208. The circuit 210 is initially in a standby state as a result of a positive going pulse having been applied to input RS2 connected to gate inputs of n-type gates 401 and 402. Such a pulse causes gates 401 and 402 to assume the conducting state, thereby causing the nodes 405 and 406 to assume the low logic state. Note that the L2 latch, consisting of p-type gates 403 and 404 connected in a series with n-type gates 408, 409, will not reset, thus will hold the data from current state. When the C input assumes the high logic state, node 412 of the L2 latch, will assume the low logic state, and node 4 13 will assume the high state through action of the L2 latch. The node 406 is connected to the gate input of n-type 414 and p-type gate 415. The high state of node 406 will cause the gate 414 to conduct, thereby pulling the output lead 450 to ground, i.e., the low logic state. As a result, this shuts off the series connected p-type gates 415 and 416.

The pair of series connected p-type gates 415 and 416 are connected in series with a pair of n-type gates 417 and 418 to form an inverter tree which hold the data at the output after the reset has occurred. Since, inputs C and T cannot both be high simultaneously, the node 405, connected to the gate of p-type gate 420, is in a low logic state when the C input is high. This causes gate 420 to provide a conducting path from the voltage source V to the gate input of n-type gate 418. Consequently, this gate will conduct. The node 413 which, as described, has a high logic value when the C input is high, is connected to the control input of n-type gate 417 causing that gate to conduct. In this manner, the output terminal 450 is connected to ground via gates 417 and 418.

When the T input lead assumes the high logic value, node 405 will be high and node 413 will be low. Node 405 is directly connected to the gate inputs of n-type gate 422 causing this gate to conduct and provide a high logic state from voltage source V to the output terminal 450. The gate 422 is specifically provided to provide a output no more than one gate delay after receipt of the T input. The same fast output is accomplished for the C input by gate 414. Since, n-type gate 422 is connected as a source follower, it cannot pull-up the output 450 all the way up to the level of power supply V. Therefore, p-type gate 445 is used to accomplish this task.

When the T input is high, the low logic state of node 413, connected to the input leads of p-type gate 416 and n-type gate 417 causes the gate 416 to be turned on and the gate 417 to be turned off. The high state of the node 405, connected to the input of series connected p-type gate 420 and n-type gate 421 causes gate 420 to be turned off and gate 421 to be turned on, thereby connecting the gate input of gate 418 to ground causing gate 418 to be turned off. As explained earlier, when the T input is high, the C input is necessarily in the low state. This causes node 406, which is connected to the inputs of gates 414 and 415, to be low. Consequently, gate 414 will be turned off to avoid connecting the output 450 to ground through that gate. Furthermore, gate 415 will be turned on. This, together with the on-state of gate 416, causes the output terminal 450 to be connected to the voltage source V.

When the input signal RS2 goes high, node 406 will be connected to ground through gate 401, causing gate 415 to remain in the conducting state. Furthermore, the reset will also cause the node 405 to be connected to ground, through gate 402. However, this will not effect the state of node 413 since gate 404, which was in the nonconducting state, and gate 409 which was in the conducting state will remain in the conducting state. Hence, the gate input of p-type gate 416 will remain in the conducting state and the output 450 will remain connected to voltage source V through the operation of gates 415 and 416, even though gate 422, which has its gate input connected to node 405, will be turned off.

The circuit 210 is provided with a test activated circuit input si and a test output sc, as well as clock signals: at, ac, bt, bc, representing true and complement inputs. Typically only one clock signal will be active at any one time. When a clock at is active, and a voltage representing a logical high is applied to the si input, the n-type gate 430 will conduct and the latch L1 will be set such that node 460 will be connected to ground through n-type gate 431. As a consequence, the p-type gate 435 will conduct causing the node 461 to be raised to the high logic level defined by the voltage source V. To shift or scan date from the L1 into the L2 latch, the a clock is deactivated and the b clock is activated. Thus, gate 436 will conduct and the high logic level will be applied to nodes 4 12 connected to the L2 latch. Furthermore, the gate 409 of the L2 latch will conduct and node 413, on the other side of L2 latch, will be at the low logic level.

P-type gate 440 and n-type 441 are connected in series between the voltage source V and ground with the sc output terminal connected between the two gates. The gate inputs of gates 440 and 441 are directly connected to the node 413. Thus, when the node 413 is low, gate 440 will conduct and the high value will be provided at test output sc. Therefore, the test output sc will always read the current state of the L2 latch.

The n-type gates 446 and 447 are a bleeder to hold the low level reset state of node 406 and 405, respectively.

Figure 5:
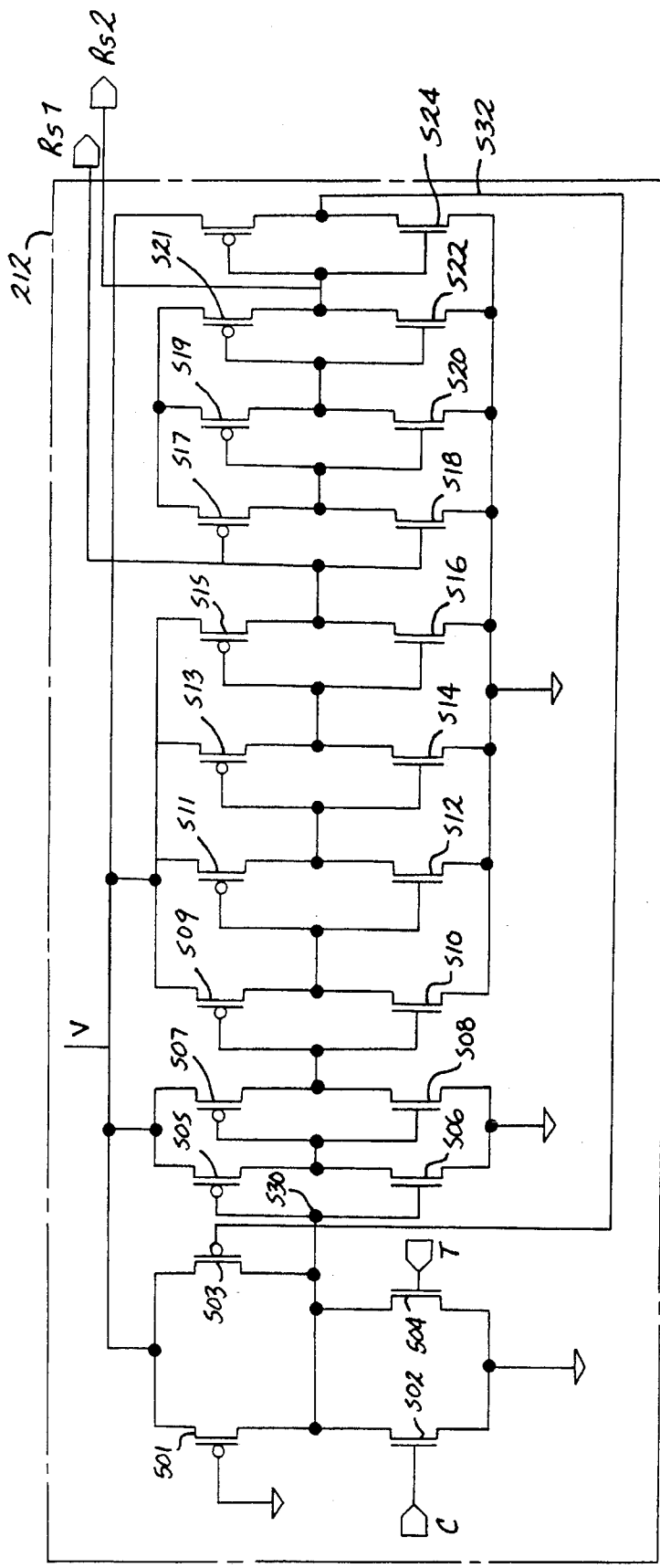
FIG. 5 is a circuit diagram representation of the reset circuit of FIG. 2.

FIG. 5 is a circuit diagram representation of the reset circuit 212 of FIG. 2. The circuit has an input C and an input T connected to input terminals of n-type gates 502 and 504. The C and T inputs are the C and T input to driver 210 shown in FIG. 2 and represent the wired-OR of the t and c outputs of the MUX circuits 202, 204, 206 and 208. When either of the C or T leads assumes the high logic level, indicating an output from one of the MUX circuits, the corresponding one of the gates 502, 504 will conduct. P-type gate 501 will hold a high level state of node 530 after p-type gate 503 resets node 530 to a high voltage state.

When either the C input or T input receives a high logic value input signal, the corresponding one of the gates 502, 504, will conduct forcing gate input of p-type 505 to a low logic level, thereby causing this gate to connect the input of n-type gate 508 to the voltage source V. As a consequence, the input of p-type gate 509 will be brought to the low logic level, causing n-type gate 512 to conduct. This will provide a low level to gate input of p-type gate 513 and consequentially a high logic level on gate input of n-type gate 516. This causes gate 516 to conduct and causes gate 515 to be turned off. Since the output RS1 is connected between gates 515 and 516, the state of this output will change from a high logical level to a low logic level and cause the reset function to be initiated in the MUX circuits 202, 204, 206 and 208. Furthermore, the low level on output on RS1 to the input of p-type gate 517 causes this gate to conduct and provide a high logic level to the input of n-type gate 520 which in turn provides a low input to p-type gate 521 and n-type gate 522. As a result, output RS2 changes from a low logic level to a high logic level signal which initiates the reset action of the driver and latch circuit 210.

The high logic level on the RS2 output, connected to the input of n-type gate 524 causes a low level signal to be applied to node 532, thereby causing the gate 503 to conduct. When the active one of the inputs C and T has returned to the low logic value as a result of the reset action of the MUX circuits 202, 204, 206 or 208 in response to the RS1 output, node 530 will assume the high logic level and gate 506 will again conduct, due to the action of gate 503, in response to the low logic level on node 532. As a result, output RS1 will again return to the high logic level and output RS2 will return to the low logic level. As can be seen, activation of either the C or T input causes the RS1 reset to occur after the occurrence of the signal on the C or T input by a time period defined by the gate delays introduced in the reset chain. After a period of time, defined by the delay of the additional gates in the chain, the RS2 reset is generated.

Figure 6:
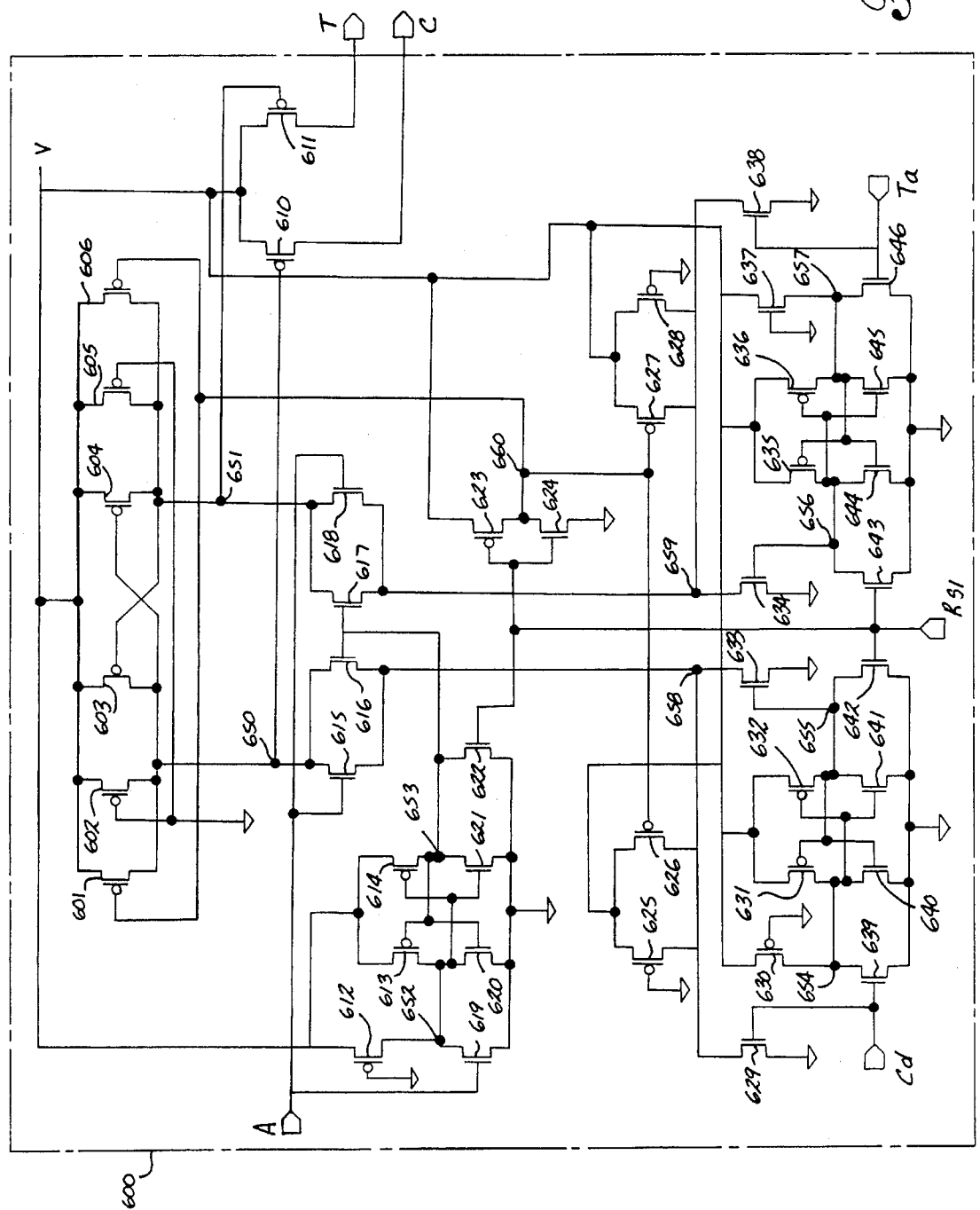
FIG. 6 is an alternate embodiment of a multiplexer element for use in the multiplexer of FIG. 2.

FIG. 6 is a circuit representation of an alternate design for the MUX circuit 202, 204, 206 and 208. The circuit of FIG. 6 differs from that of FIG. 3 in that the circuit FIG. 6 includes pulse alignment latches. Since the select signals A, B, C, D, shown in FIG. 2, which serve to activate the selected MUX circuit are not synchronized with the input data e.g. Ta, Ca, alignment may be required. This is particularly true in the case where self-reset CMOS logic circuits are used since these circuits are reset asynchronously. FIG. 6 shows an implementation of a multiplex circuit such as MUX 202 provided with latches for latching the state of the select input A as well as the Ca and Ta inputs.

Referring to FIG. 6, when a positive pulse occurs on the select lead A, the n-type gates 615 and 618 will be enabled and n-type gate 619 will begin to conduct pulling the node 652 to a low level. This causes the latch L1, consisting of p-type gates 613, 614 and n-type gates 620, 621 to 614 will be enabled and 621 will be disabled causing node 653 to assume the high logic state. This high logic state is applied to the gate input of n-type gates 616 and 617 causing the nodes 658 and 659 to assume the high logic state. When either the Ca input or the Ta input receives a high logic pulse, one of the two n-type gates 639, 646 will begin to conduct pulling one of the nodes 654, 657, respectively, to the low level logic state, causing the latch L2 or latch L3 to be set. In the event of a high logic signal on the Ca input, the node 654 will be pulled low causing p-type gate 632 of latch L2 to conduct bringing node 655 to the logic high state. Node 655 is connected to the gate input of n-type gate 633 causing that gate to be activated and providing a path to ground for n-type gates 615 and 616 from node 650, pulling this node to the low logic level. As will be apparent, the connection of the A input to gates 615 and 618 enables these gates to begin to conduct as soon as the associated one of the Ca and Ta receive the high logic pulse. Since the state of the A input is latched in latch L1, the n-type gates 616 and 617 are activated by the output of the latch L1 and will remain activated even after the select pulse on input A has disappeared. It will be apparent that a high logic pulse on input Ta will cause n-type gate 646 to conduct pulling node 657 to the low logic state thereby causing gate 635 of the latch L3 to conduct and causing n-type gate 644 to be disabled thereby raising node 656 to the high logic level. Furthermore, n-type gate 634, connected to the common drain of gates 617 and 618, will conduct pulling node 651 to a low logic value.

The C output is connected to the drain of p-type gate 610, which has its gate input connected to the node 650. When the node 650 is low due to presence of high logic pulse on the Ca input, a positive pulse will be generated on the C output lead. Similarly, the T output is connected to the drain lead of p-type gate 611 having its gate input connected to node 651. Consequently, the T output will be logical high as a result of a high logic pulse on input terminal Ta.

The circuit 600 is responsive to a reset signal RS1 from the reset circuit 212. In this case, RSI would be derived from the drain nodes of p-type gate 513 and n-type gate 514, instead of the drain nodes of p-type gate 515 and n-type gate 516. As a result, the reset pulse RS1 is a high going pulse. Within the circuit 600, the RS1 lead is connected to the gate inputs of n-type gates 642 and 643 as well as the gate inputs of n-type gates 622 and 624 and p-type gate 623. The high going reset pulse on the gate inputs of gates 642 and 643 causes the low logic value to occur at nodes 655 and 656. This will disconnect nodes 658 and 659 from ground through gates 633 and 634. Furthermore, the gate inputs of p-type gates 636 and n-type gates 645 will be pulled low causing latch L3 to be reset by maintaining node 656 at the low logic level and node 657 at the high logic level in preparation for a next Ta input pulse. Similarly, the high going reset pulse on the gate input of gate 642 will cause node 655 to be pulled low thereby bringing the n-type gate 633 to the nonconducting state. Furthermore, the latch L2 will be reset by the low state of node 655, which is connected to the gate input of p-type gate 631 and the gate input of n-type gate 640, causing the flip-flop to be reset such that node 655 remains low after the disappearance of the RS1 reset pulse. Consequently, node 654 on the other side of latch L2 will be in the high state charging the Ca input gate 639.

The RS1 lead, via its connection to the gate input of n-type gate 622 causes latch L1 to be reset by pulling node 653 to the low logic state, which causes node 652 to be brought to the high logic state. Accordingly, the input gate 619 will be harged and prepared for the next application of a select signal on the A input lead. The connection of RS1 to the gate input of series connected p-type gate 623 and n-type gate 624 causes a negative going pulse to occur at node 660 since gate 623 will be cut off and gate 624 will connect node 660 to ground. The negative pulse on node 660, which is connected to the gate inputs of p-type gates 601 and 606, will cause these gates to conduct and charge gates 615 through 618 via nodes 650 and 651. The nodes 650 and 651 are connected to the gate inputs of p-type gates 610 and 611, connected to outputs C and T, respectively.

P-type gates 602, 605, 612, 625, 628, 630 and 637 have their gate leads connected to ground causing these gates to be turned on at all times. They are bleeder gates which maintain the high level of nodes 650 and 651 when the reset has disappeared. Gates 603 and 604 serve to latch the states of the nodes 650 and 651 and therefore the states of outputs C and T, respectively. The latch formed by gate 603 and 604 is reset when both nodes 650 and 651 are forced to the high state as a result of the reset signal.

It will be understood that the above-described embodiment is merely illustrative of the application of the principles of the invention and that other arrangements may be devised by those skilled in the art without departing from the scope of the invention as defined by the appended claims.

What is claimed is:

1. A multiplex circuit comprising:

an input circuit, having true and complement inputs and true and complement outputs;

an output circuit having true and complement inputs and an output and comprising a data latch responsive to a first latch signal to assume a first latch state and responsive to a second latch signal to assume a second latch state;

the true and complement outputs of the input circuit connected to the true and complement inputs, respectively, of the output circuit;

the output circuit further comprising a first latch control gate connected to the latch and to one of the true and complement inputs of the output circuit and a second latch control gate connected to the latch and to the other of the true and complement inputs of the output circuit and a first output gate connected to the output terminal of the output circuit and to one of the true and complement inputs of the output circuit and a second output gate connected to the output terminal of the output circuit and connected to the other of the true and complement inputs of the output circuit, the first and second latch control gates responsive to signals on the true and complement inputs of the output circuit to generate first and second latch signals, respectively, and the first and second output gates responsive to true and complement signals on the true and complement inputs of the output circuit to produce an output signal on the output of the output circuit independent of the operation of the latch.

2. The multiplex circuit in accordance with claim 1 and wherein the output circuit comprises an additional output gate connected in parallel with the first output gate to establish and maintain a desired output signal level at the output terminal of the output circuit.

3. The circuit in accordance with claim 2 wherein the input circuit comprises a select input and first and second pairs of complementary input gates connected to the true and complement inputs, respectively, of the input circuit and a pair of control gates connected to the select input and a pair of output gates, wherein the control gates are connected in series between the inputs and outputs of the input circuits, the input circuit further comprising a latch for maintaining a state of the outputs of the input circuit after termination of an input signal.

4. The circuit in accordance with claim 2 and wherein the output circuit further comprises a pair of series connected CMOS gates each having a gate terminal connected to one of the inputs of the output circuit and operative to control the state of the additional output gate.

5. The circuit in accordance with claim 4 and wherein the output circuit further comprises an inverter tree comprising a pair of series connected P-channel MOS gates connected in series with a pair of series connected N-channel MOS gates at an interconnecting node connected to the output of the output circuit, and a reset terminal, the output circuit responsive to a reset signal on the reset terminal to reset the data latch, the inverter tree operative to retain the state of the output of the output circuit after the resetting of the data latch.

6. The circuit in accordance with claim 5 wherein one of the P-channel gates has a gate terminal connected to one of the true and complement outputs and wherein the other of the P-channel gates has a gate terminal connected to one side of the data latch and to the gate terminal of one of the N-channel gates of the inverter tree, the other of the N-channel gates of the inverter tree having a gate terminal connected to the pair of series connected CMOS gates.

7. The circuit in accordance with claim 6 and wherein the output circuit comprises a reset terminal and a voltage source terminal and a ground terminal and first and second N-channel MOS gates connected between the ground terminal and the true and complement inputs, respectively, each of the N-channel MOS gates having a gate input connected to the voltage source terminal and operative to provide a low current drain to ground and to assure that the true and complement input terminals of the output circuit remain at a ground level after a reset signal on the reset input terminal has been terminated.

8. The circuit in accordance with claim 7 and wherein the output circuit further comprises a test latch and a first test input gate connected to the test latch and responsive to a first control signal and a test input signal for latching the test input signal in the test latch and a second test input gate connected between the test latch and the data latch and responsive to a second control signal to latch the state of the test latch in the data latch.

9. The circuit in accordance with claim 8 wherein the input circuit comprises a select input and a control latch connected to the select input and responsive to a select control signal on the select input to latch the state of the select control signal and to enable the input circuit to receive signals on the true and complement inputs of the input circuit.

10. The circuit in accordance with claim 9 wherein the input circuit further comprises first and second input latches, connected to the true and complement inputs of the input circuit, respectively, for latching the state of pulses on the true and complement inputs of the input circuit.

11. The circuit in accordance with claim 10 wherein the input circuit further comprises first and second input gates connected to the true and complement inputs, respectively, of the input circuit and the true and complement outputs, respectively, of the input circuit and operative in parallel with the first and second input latches, respectively, whereby the first and second input gates are operative to initiate an output signal for the input circuit independent of the operation of the first and second input latches.

12. The circuit in accordance with claim 10 wherein the first and second input latches are connected to the reset input of the input circuit and further comprising first and second current supply gates connected to the first and second input latches, respectively, for maintaining the first and second latches in a reset condition after termination of a reset pulse.

13. The circuit in accordance with claim 11 wherein the input circuit further comprises first and second P-channel MOS gates having a gate terminal connected to ground to maintain internal nodes of the circuit at a pre-defined level to prevent activation of the circuit in response to short duration noise spikes.

14. The circuit in accordance with claim 12 wherein the input circuit further comprises a by-pass gate connected to the select input of the input circuit to enable the circuit independent of the operation of the control latch.

15. The circuit in accordance with claim 1 and further comprising a reset chain generating a reset pulse for asynchrously resetting the input circuit.

16. The circuit in accordance with claim 15 wherein the reset chain generates an additional reset pulse a predetermined period of time after the reset pulse for resetting the input circuit and the additional reset pulse is operative to reset the output circuit.

* * * * *

UNITED STATES PATENT AND TRADEMARK OFFICE
CERTIFICATE OF CORRECTION

PATENT NO. : 5,552,745
DATED : Sep. 3, 1996
INVENTOR(S) : Antonio R. Pelella et al.

It is certified that error appears in the above-indentified patent and that said Letters Patent is hereby corrected as shown below:

Column 6, line 3    After "to" add --be activated such that gate--.

Signed and Sealed this

Third Day of December, 1996

Attest:

BRUCE LEHMAN

Attesting Officer                Commissioner of Patents and Trademarks